(12) United States Patent
Bilic et al.

(10) Patent No.: US 9,790,085 B1
(45) Date of Patent: Oct. 17, 2017

(54) ACTIVELY PREVENTING CHARGE INDUCED LEAKAGE OF SEMICONDUCTOR DEVICES

(71) Applicant: Freescale Semiconductor Inc., Austin, TX (US)

(72) Inventors: Dubravka Bilic, Scottsdale, AZ (US); Andrew C. McNeil, Chandler, AZ (US); Lianjun Liu, Chandler, AZ (US); Margaret Kniffin, Chandler, AZ (US); Chad Dawson, Queen Creek, AZ (US); Colin Stevens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/184,871

(22) Filed: Jun. 16, 2016

(51) Int. Cl.
| | |
|---|---|
| *H01L 23/552* | (2006.01) |
| *B81B 7/00* | (2006.01) |
| *H01L 23/528* | (2006.01) |
| *H01L 29/06* | (2006.01) |
| *H01L 27/088* | (2006.01) |
| *H01L 23/00* | (2006.01) |
| *H01L 23/48* | (2006.01) |

(Continued)

(52) U.S. Cl.
CPC ........ B81B 7/0064 (2013.01); B81C 1/00333 (2013.01); H01L 21/768 (2013.01); H01L 23/481 (2013.01); H01L 23/528 (2013.01); H01L 23/552 (2013.01); H01L 24/05 (2013.01); H01L 27/088 (2013.01); H01L 29/0684 (2013.01); *B81B 2207/07* (2013.01)

(58) Field of Classification Search
CPC .............. B81B 7/0064; B81B 2207/07; B81C 1/00333; H01L 23/552; H01L 23/528; H01L 23/481; H01L 29/0684; H01L 24/05; H01L 21/768; H01L 27/088; G01L 2009/0069; G01L 9/06
See application file for complete search history.

(56) References Cited

U.S. PATENT DOCUMENTS

| | | | |
|---|---|---|---|
| 4,499,481 A * | 2/1985 | Greene | ............... H01L 29/1029 257/194 |
| 4,996,575 A | 2/1991 | Ipri et al. | |

(Continued)

OTHER PUBLICATIONS

J. Wibbeler et al., "Parasitic charging of dielectric surfaces in capacitive microelectromechanical systems (MEMS)," Sensors and Actuators, A 71, 1998, pp. 74-80; 7 pages.

*Primary Examiner* — A. Sefer
(74) *Attorney, Agent, or Firm* — Charlene R. Jacobsen (57) ABSTRACT

A structure for preventing charge induced leakage of a semiconductor device includes a shield separated from a first interconnect by at least a first lateral spacing and separated from a second interconnect by at least a second lateral spacing. The first interconnect is connected to a first junction and the second interconnect is connected to a second junction. A shield bias is connected to the shield to terminate an electromagnetic field on the shield. The shield between the first and second lateral spacings has a minimum width to substantially prevent formation of a conductive channel between the first and second junctions. The shield may be formed over a portion of the first junction and over a portion of the second junction to substantially prevent formation of another conductive channel between the first and second junctions at a location that does not have the first and second lateral spacings.

12 Claims, 10 Drawing Sheets

(51) Int. Cl.
*B81C 1/00* (2006.01)
*H01L 21/768* (2006.01)

(56) References Cited

U.S. PATENT DOCUMENTS

| | | | |
|---|---|---|---|
| 5,323,020 A * | 6/1994 | Mohammad | H01L 29/1029 |
| | | | 257/19 |
| 5,536,953 A * | 7/1996 | Dreifus | H01L 29/1029 |
| | | | 257/215 |
| 5,592,391 A | 1/1997 | Muyshondt et al. | |
| 6,555,888 B2 | 4/2003 | Lepert et al. | |
| 6,660,552 B2 | 12/2003 | Payne et al. | |
| 6,696,369 B2 | 2/2004 | Fraser et al. | |
| 6,740,945 B2 | 5/2004 | Lepert et al. | |
| 8,653,634 B2 | 2/2014 | Chiu et al. | |
| 9,136,165 B2 | 9/2015 | Zhang et al. | |
| 2003/0178655 A1* | 9/2003 | Winslow | H01L 29/66871 |
| | | | 257/280 |
| 2006/0214202 A1* | 9/2006 | Zorich | G01L 9/0055 |
| | | | 257/294 |
| 2013/0292790 A1* | 11/2013 | Minoura | H01L 27/0814 |
| | | | 257/471 |
| 2014/0239421 A1 | 8/2014 | Graham et al. | |
| 2015/0135854 A1* | 5/2015 | McNeal | G01L 9/0054 |
| | | | 73/861.351 |

* cited by examiner

ACTIVELY PREVENTING CHARGE INDUCED LEAKAGE OF SEMICONDUCTOR DEVICES

FIELD

This disclosure relates generally to semiconductor structures, and more specifically to a structure for preventing charge accumulation on a surface of a semiconductor device and a method for fabricating the same.

BACKGROUND

Dielectrics are commonly used in semiconductor devices for isolation and charge storage. Undesirable charge accumulation can occur on the surface of the device coated with a dielectric as well as on intermediate layers that are capacitively coupled to the surface. Such charge accumulation can occur during manufacturing of the device, (e.g. through reactive ion etching and other steps employing electric fields) or part assembly. Charge accumulation can also occur while the device is being used following manufacturing (e.g. from stray electromagnetic coupling). Accumulated charge on a semiconductor surface can persist for a significant duration depending in part on environmental factors such as temperature and humidity.

Accumulated charge is responsible for many deleterious effects including the introduction of electric field offsets (e.g. stiction), thin oxide tunneling, oxide breakdown, and the formation of conductive channels between transistor terminal junctions. As device geometries continue to shrink for microsensors, microactuators, and semiconductors in general, coupled with increased performance demands, the level of tolerable charge accumulation continues to decrease. Current methods to prevent charge accumulation rely on shielding of the entire device, thus requiring additional isolation and costly processing steps. Other methods are limited to protecting the device only during manufacturing.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods described herein provide for the prevention of leakage induced by accumulated charge on semiconductor devices during the fabrication and subsequent usage of the device, in addition to other advantages. A cost effective shield that terminates an electromagnetic (EM) field induced by the accumulated charge is formed with a conductive layer requiring no vertical isolation from other conductive metal interconnect layers. The shield requires a novel geometry to prevent the formation of conductive channels between underlying junctions that would otherwise form due to accumulated charge on the semiconductor device. The design of the shield requires a lateral separation from metal interconnect layers that will introduce regions of potential inversion, however the design of the shield ensures that these localized regions of inversion will not provide a conduction path between underlying junctions.

Figure 1:
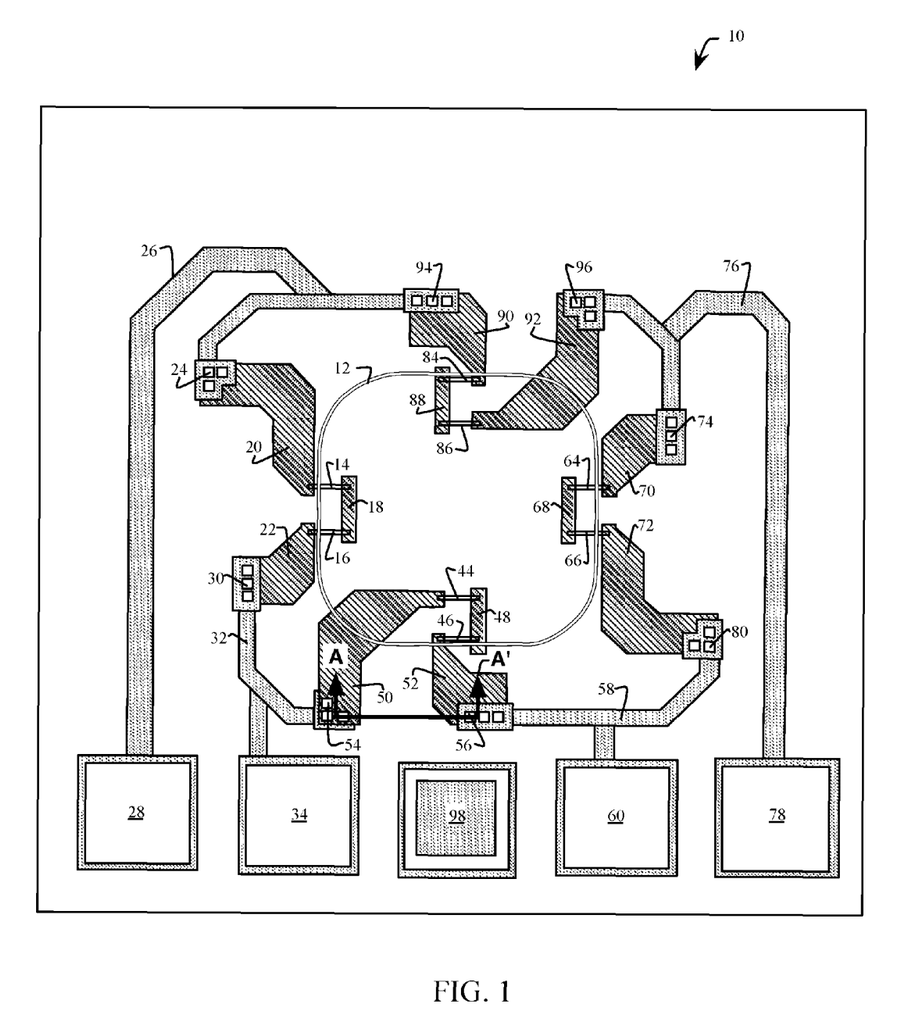
FIG. 1 is a schematic view of an embodiment of a piezo-resistive transducer (PRT) without a charge shield.

FIG. 1 shows an example embodiment 10 of a PRT without a shield for preventing charge induced leakage. The embodiment 10 includes a diaphragm 12 allowing a plurality of piezo-resistors (PRs) to distort with a mechanical strain as pressure is applied to the diaphragm 12. The physical distortion of the PRs induces a change in the resistance of the PRs, which is sensed to provide a measure of the change in pressure. In another embodiment, several PRs are arranged to measure an acceleration vector.

The embodiment 10 includes a PR 14 and a PR 16 each formed with a P− dopant, and connected to a P+ doped junction 18. The PR 14 and PR 16 are further connected to a respective P+ doped junction 20 and P+ doped junction 22. The P+ doped junction 20 is connected with one or more contacts 24 to a metal interconnect 26. The metal interconnect 26 is connected to a bond pad 28. The P+ doped junction 22 is connected with one or more contacts 30 to a metal interconnect 32. The metal interconnect 32 is connected to a bond pad 34. The embodiment 10 further includes a PR 44 and a PR 46 each formed with a P− dopant, and connected to a P+ doped junction 48. The PR 44 and PR 46 are further connected to a respective P+ doped junction 50 and P+ doped junction 52. The P+ doped junction 50 is connected with one or more contacts 54 to the metal interconnect 32. The P+ doped junction 52 is connected with one or more contacts 56 to a metal interconnect 58. The metal interconnect 58 is connected to a bond pad 60. The embodiment 10 further includes a PR 64 and a PR 66 each formed with a P− dopant, and connected to a P+ doped junction 68. The PR 64 and PR 66 are further connected to a respective P+ doped junction 70 and P+ doped junction 72. The P+ doped junction 70 is connected with one or more contacts 74 to the metal interconnect 76. The metal interconnect 76 is connected to a bond pad 78. The P+ doped junction 72 is connected with one or more contacts 80 to the metal interconnect 58. The embodiment 10 further includes a PR 84 and a PR 86 each formed with a P− dopant, and connected to a P+ doped junction 88. The PR 84 and PR 86 are further connected to a respective P+ doped junction 90 and P+ doped junction 92. The P+ doped junction 90 is connected with one or more contacts 94 to the metal interconnect 26. The P+ doped junction 92 is connected with one or more contacts 96 to the metal interconnect 76.

The embodiment 10 includes a bond pad 98 connected to the substrate, upon which the PRT is formed. In one embodiment, the substrate is connected to the highest supply potential (e.g. VDD), although other substrate bias levels are usable within the limits of preventing forward conduction of parasitic diodes on the PRT structure. In another embodiment, one or more pairs of PRs (e.g. PR 14 and PR 16) are formed with an N− dopant and are connected to, and straddle, N+ doped junctions. The term "doped junction" includes junctions formed by one or more methods, including without limit, implantation and diffusion. The term "metal interconnect" refers to a conductive connection that electrically connects two or more elements. It should be understood that while the contacts shown in FIG. 1 (e.g. contacts 24, 30, 54, 56, 74, 80, 96 and 94) are shown in clusters of three, others embodiments may include one, two or more than three contacts per cluster without departing from the scope and spirit of this disclosure.

Figure 2:
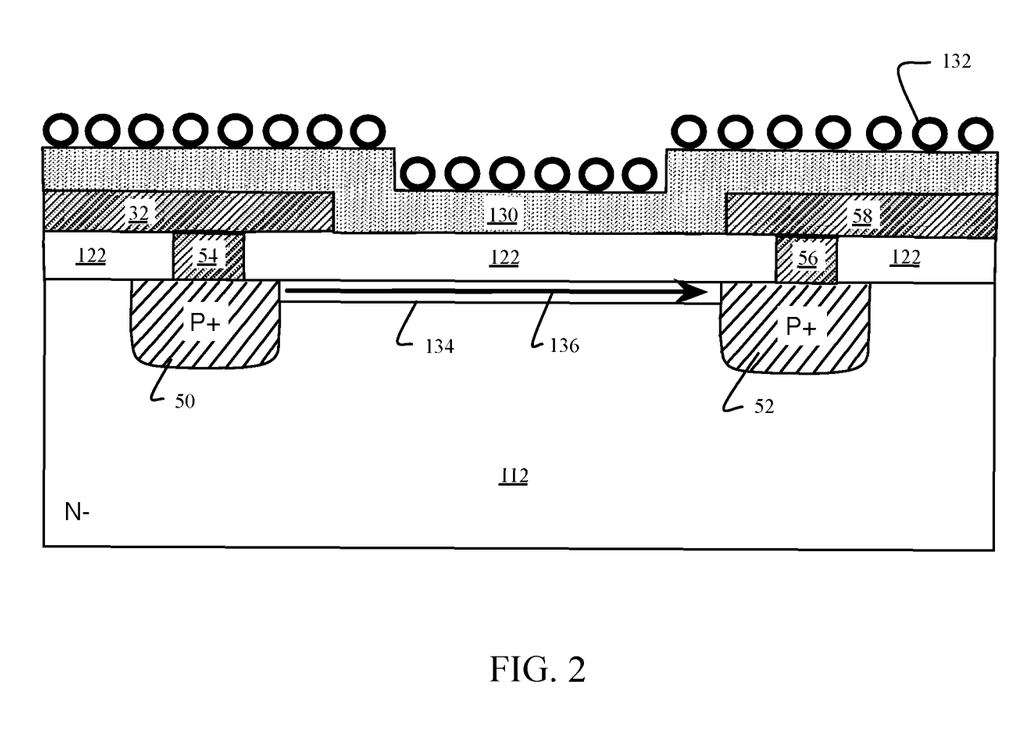
FIG. 2 is a cross-sectional view of FIG. 1 taken along A-A' illustrating a leakage path between a pair of junctions, induced by accumulated charge on the surface of the PRT.

Turning to FIG. 2 and with continued reference to FIG. 1, an undesirable consequence of charge accumulation on the surface of the PRT will now be described. A cross-section of the embodiment 10 includes an N− substrate 112 (e.g. a silicon substrate lightly doped with an N-type donor species). The substrate 112 includes the P+ doped junctions 50 and 52, connected to respective metal interconnects 32 and 58, through respective contacts 54 and 56. The substrate 112 is covered by an oxide layer 122 and an overlying nitride passivation layer 130. A negative charge 132 accumulates on the nitride layer 130, resulting in an inversion layer 134 (or "conduction channel") and subsequent conduction 136 between the P+ doped junctions 50 and 52. In one example, the conduction channel 136 results in an undesirable offset bias to devices connected to P+ doped junctions 50 and 52. The resulting conduction channel 136 is shown as an embodiment 10 of a PRT. However, it is envisioned that the methods and systems described herein apply to similar Micro-Electro-Mechanical Systems (MEMS) and in semiconductor devices in general that are sensitive to stray conduction channels and electric fields. References to PRT devices should not be construed as limiting the spirit, scope or teachings of this disclosure.

Figure 3:
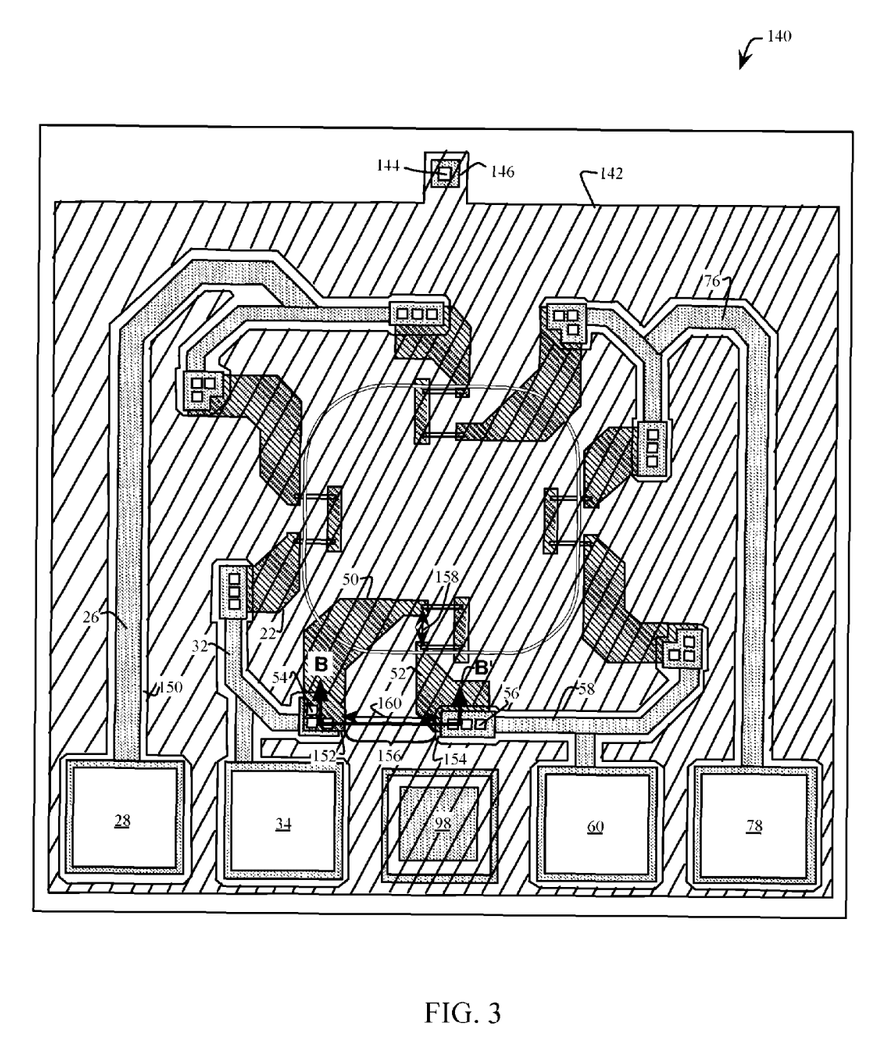
FIG. 3 is a schematic view of an embodiment of a PRT with a charge shield.

FIG. 3 shows an embodiment 140 of a PRT with a shield 142 for terminating an EM field induced by charge accumulating on the surface of the PRT. With reference to FIG. 1, FIG. 2 and FIG. 3, in one embodiment, a shield 142 is connected with at least one contact 144 to a charge sink 146. In various embodiments, the charge sink 146 is a diffusion region connected to the substrate 112 of the PRT. In some embodiments, the shield 142 does not vertically overlap any of the metal interconnects (e.g., 26, 32,58, and 76). A vertical overlap of the shield 142 with the metal interconnect might otherwise result in the shield 142 physically and electrically contacting the metal interconnect. Instead, the shield 142 is geometrically designed to have a lateral separation (substantially orthogonal to the vertical overlap) from each metal interconnect (e.g., 26, 32, 58, and 76) that is not electrically connected to the shield bias source 146. For example, the shield 142 is isolated from the metal interconnect 26 by a lateral spacing 150. The lateral spacing 150 need not be the same width at all points along the metal interconnect 26, however the lateral spacing 150 should be sufficient to avoid shorts between the shield and metal interconnect.

In one example embodiment, the shield 142 is configured to contact one of a first metal interconnect 32 connected to a first doped junction 50 and a second metal interconnect 58 connected to a second doped junction 52 at any location where the shield 142 has a vertical overlap with the respective first metal interconnect 32 and second metal interconnect 58. Restated, the shield 142 will contact one or more metal interconnects in the absence of a lateral spacing unless there is an oxide or similar isolator vertically disposed between the shield 142 and the metal interconnect.

Advantageously, additional process steps are not required to deposit and pattern dielectric layers to isolate the shield 142 from the metal interconnects. In addition, in various embodiments, the shield 142 may be added to an existing fabrication process with minimal or no required modifications to the existing process flow. For example, in alternative embodiments, portions of the shield 142 may be vertically overlapped with the metal interconnects (e.g., 26, 32, and 58) to simplify some process steps. In such a configuration, those portions of the shield 142 that are vertically overlapped with the metal interconnects must be electrically isolated with the remainder of the shield 142 via the lateral separation.

Figure 4:
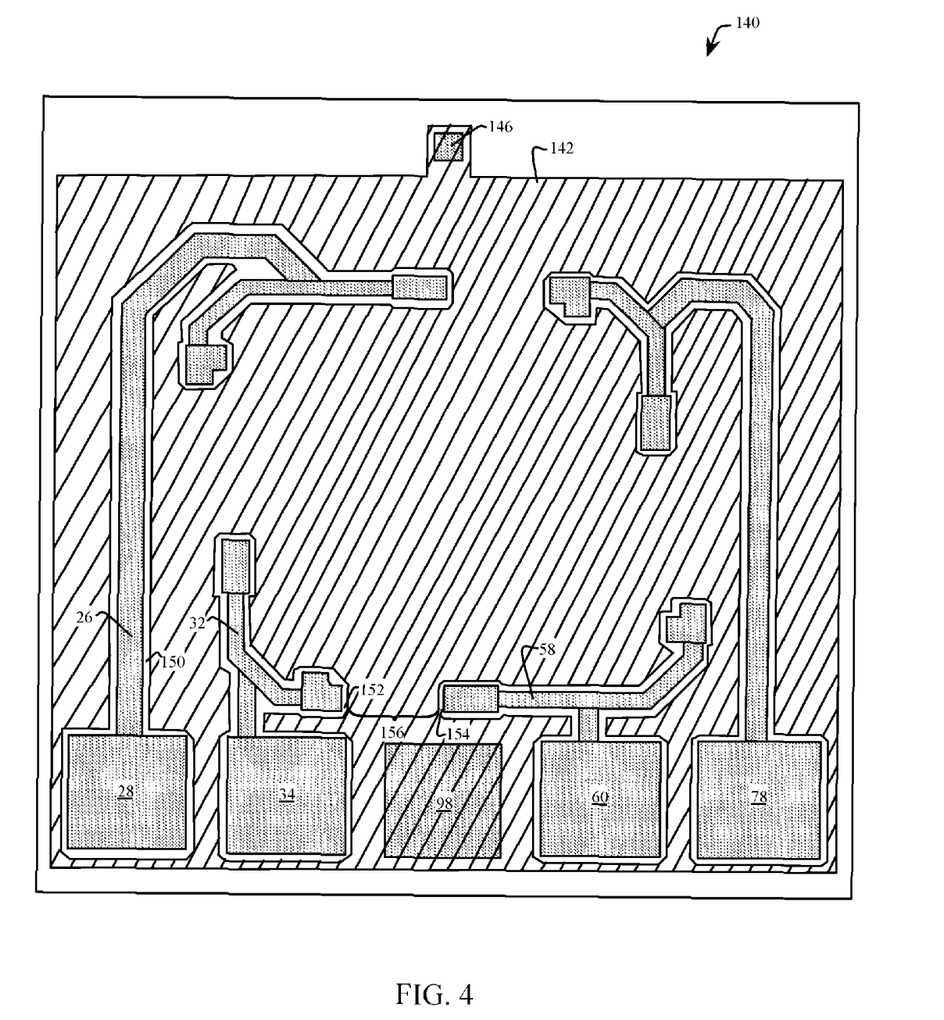
FIG. 4 is a schematic view of FIG. 3 showing only the metal interconnect and shield layers.

The lateral spacing between the shield 142 and metal interconnects needs to be wide enough to avoid manufacturing yield loss due to shorts but also narrow enough to prevent conduction between adjacently disposed junctions, or a pair of junctions between which a conduction channel can form. Without the shield 142, even junctions that are not parallel to one another can still result in a conduction channel depending upon various factors such as the extent of the accumulated charging effects on inverting the surface of the substrate 112 and doping levels. In the embodiment 140, the shield 142 has a first lateral spacing 152 at the metal interconnect 32 near the junction 50. The shield 142 also has a second lateral spacing 154 at the metal interconnect 58 near the junction 52. The shield 142 has a resulting minimum width 156 between the first lateral spacing 152 and the second lateral spacing 154. FIG. 4 further illustrates the relationship of each lateral spacing, metal interconnects and minimum width of the shield.

Figure 5:
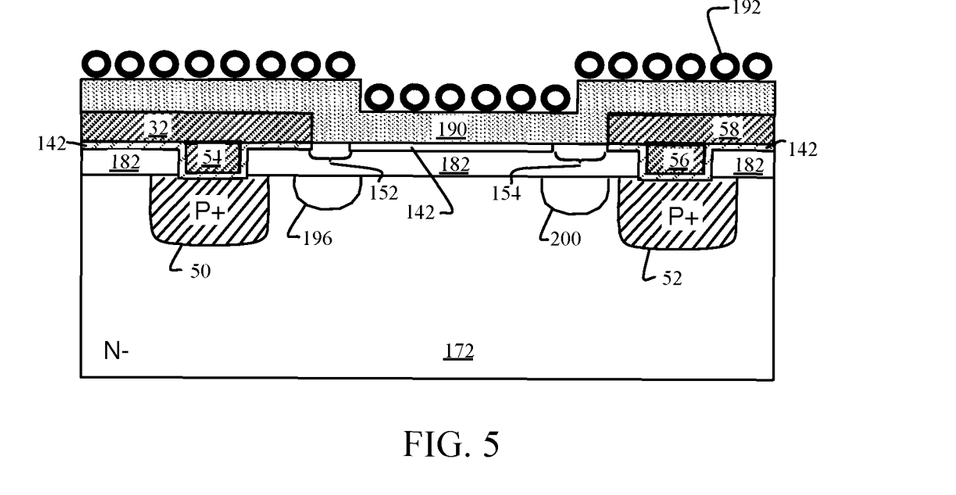
FIG. 5 is a cross-sectional view of FIG. 3 taken along B-B' illustrating the absence of a leakage path, wherein an electromagnetic (EM) field resulting from an accumulated charge is terminated on the shield.

With reference to FIG. 3, FIG. 4, and FIG. 5, the function of the shield 142 is further explained. In the embodiment 140, the shield 142 prevents a first conductive channel 158 (see FIG. 3) from forming between the junction 50 and the junction 52 by completely overlapping the space between the junctions 50 and 52 with the shield 142. The shield 142 also prevents a second conductive channel 160 (see FIG. 3) from forming between the junctions 50 and 52 where the shield has a lateral separation at the metal interconnects 32 and 58 connected to their respective junctions 50 and 52. The first conductive channel 158 and the second conductive channel 160 are shown to illustrate an implementation and function of the shield, however numerous combinations of shielded conductive channels (e.g. leakage paths) exists between the various combinations of junctions (e.g. between 20 and 22). The discussion herein of two conductive channels is for clarity and is not intended to limit the application of the shield to other potential conductive channels.

In FIG. 5, a cross-section of the embodiment 140 includes an N− substrate 172. The substrate 172 includes the P+ doped junctions 50 and 52, connected to respective metal interconnects 32 and 58 through respective contacts 54 and 56. The substrate 172 includes an oxide layer 182 and the shield 142. A portion of the shield 142 between the junctions 50 and 52 is further covered by an overlying nitride passivation layer 190, upon which a negative charge 192 accumulates. It should be further observed in FIG. 5 that separate portions of the shield 142 underlie metal interconnects 32, 58 and at least partially surround contacts 54, 58. As discussed previously, such a configuration may result in simplified fabrication process steps. However, it bears repeating that these separate portions of the shield 142 underlying metal interconnects 32, 58 and contacts 54, 58 are electrically isolated from the laterally spaced remainder of the shield 142 or in alternative embodiments, these separate portions of the shield 142 may not be present.

The shield 142 between first and second lateral spacings 152, 154 may completely terminate an EM field induced by the accumulated charge 192. However, in some embodiments, the EM field is only partially removed. In some embodiments, a residual EM field may form where unshielded regions of the charge 192 forms isolated regions of inversion pockets 196 and 200 corresponding the first lateral spacing 152 and the second lateral spacing 154 respectively. The inversion pockets 196 and 200 may merge with their respective junctions 50 and 52 depending on doping levels and the amount of the residual field, however the minimum width 156 of the shield 142 (shown in FIG. 3 and FIG. 4) ensures that a continuous leakage path between the junctions 50 and 52 cannot form.

In some examples, an incomplete termination of the EM field lines induced by the charge 192 occurs due to the sheet resistance of the shield 142 being greater than zero, or from a transient response of shield 142. Various scenarios that result in imperfect EM field line termination are effectively managed by ensuring a minimum width 156 of the shield 142 between points of lateral separation with metal interconnects. In some embodiments, the shield bias source 146 employs a single contacted region 144 as shown at the top of FIG. 3. In other embodiments, a substrate connected bond pad 98 provides the connection of the shield 142 to the shield bias source (in this case the shield bias source is the substrate). In other embodiments, the shield 142 is connected to the substrate by at least one of the contacted region 144 and the bond pad 98. The number of connections between the shield 142 and the charge sink (or substrate in various embodiments) is chosen depending upon the sheet resistance of the shield 142 and degree of induced EM field on the shield 142. In some embodiments, the shield 142 is a thin layer (relative to the thickness of the metal interconnect) of Titanium Nitride (TiN). In some embodiments, the first lateral spacing 152 and the second lateral spacing 154 are the same. In other embodiments, the first lateral spacing 152 and the second lateral spacing 154 are different.

Figure 6:
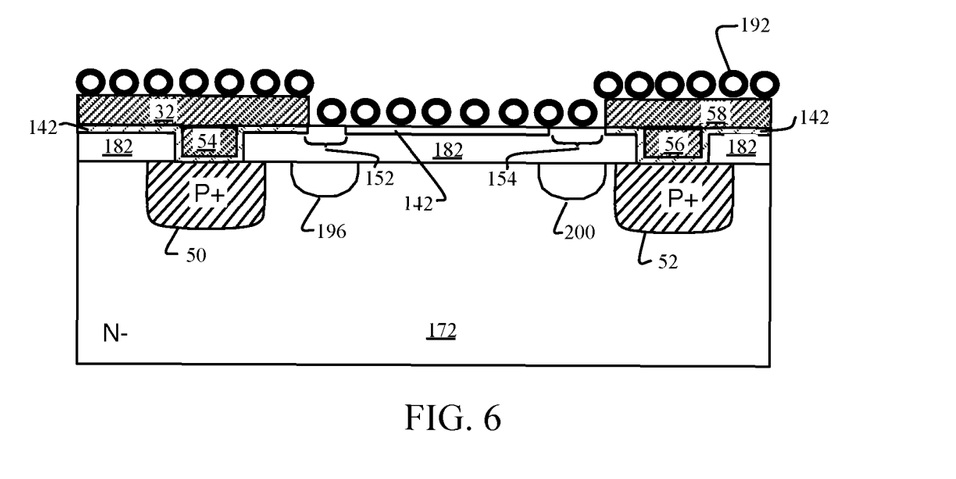
FIG. 6 is a cross-sectional view of FIG. 3 taken along B-B' illustrating the absence of a leakage path wherein an accumulated charge is deposited directly on the shield.

In FIG. 5, the accumulated charge 192 induces an EM field onto to the shield 142 across the nitride passivation layer 190. FIG. 6 shows another embodiment without the nitride passivation layer 190, wherein the accumulated charge 192 is deposited directly on to the shield 142 thus permitting a higher resistance shield 142 to be used at the expense of less device protection without the nitride passivation layer 190. In other embodiments, prevention of the first conductive channel 158 and the second conductive channel 160 includes substantially mitigating the formation of the respective channels depending upon the PRT device operating requirements.

Figure 7:
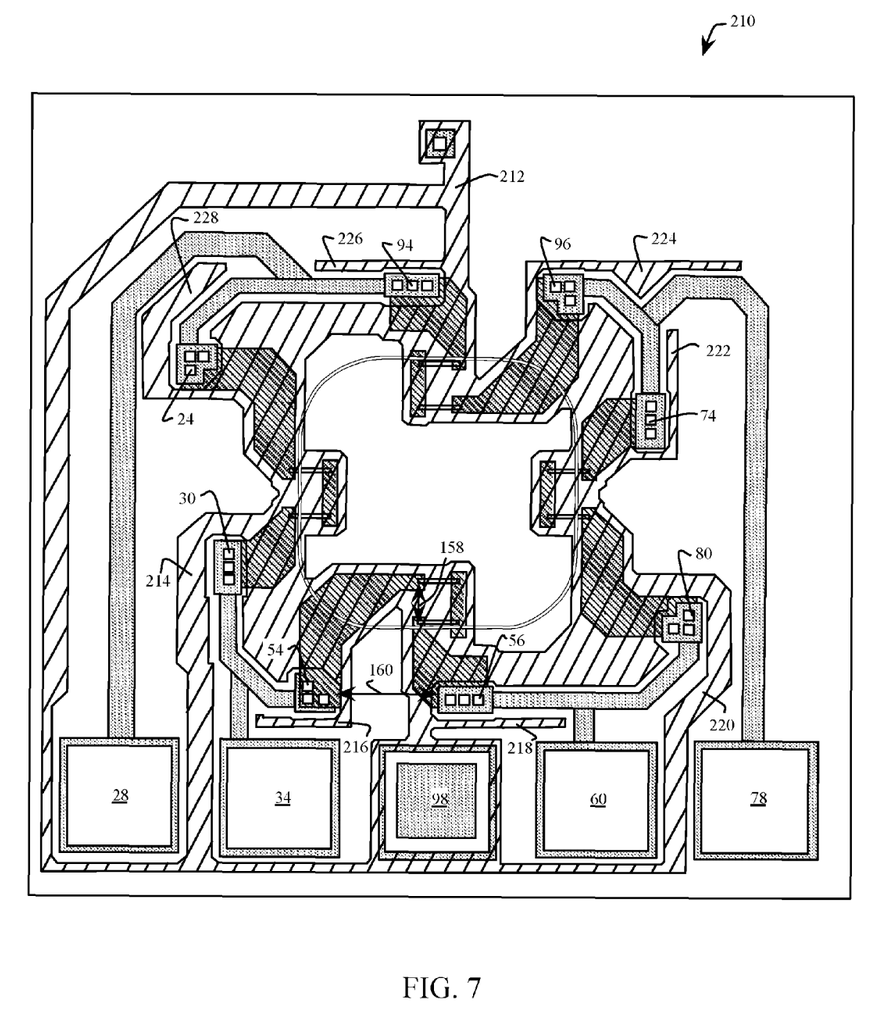
FIG. 7 is a schematic view of an embodiment of a PRT with a charge shield partially surrounding bond pads.
Figure 8:
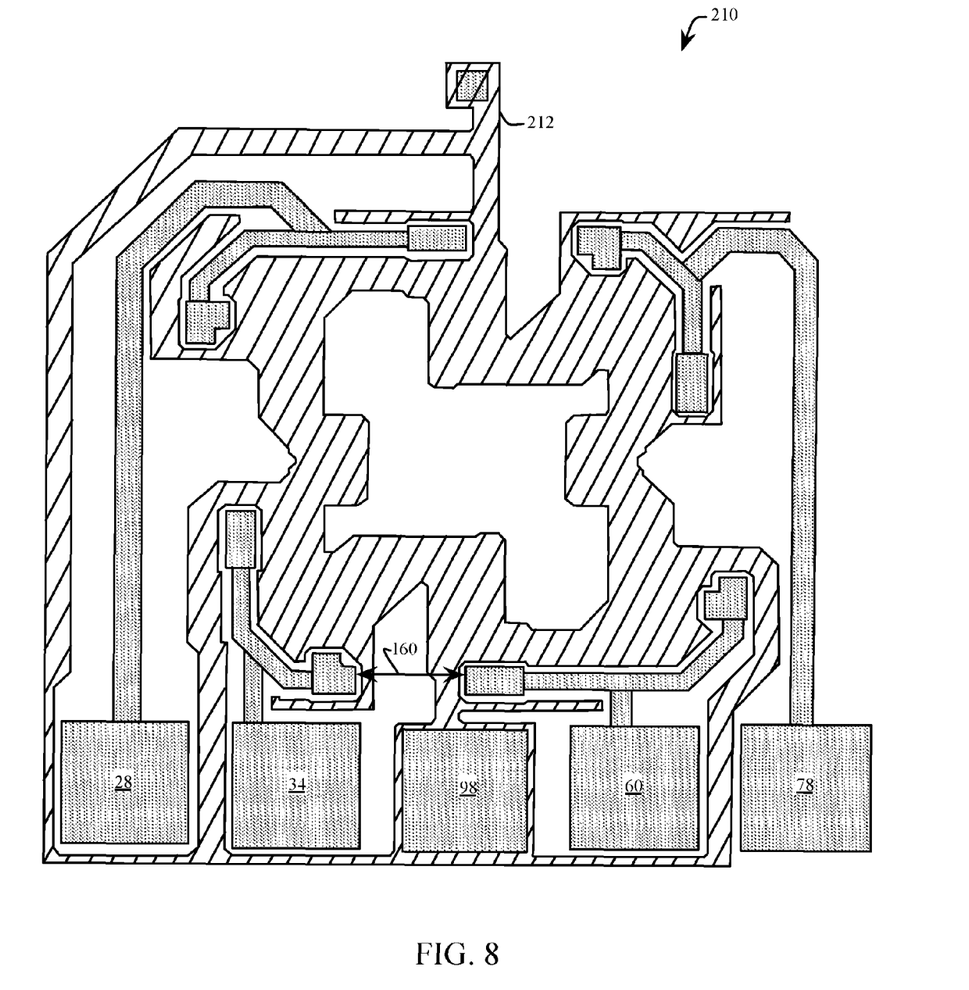
FIG. 8 is schematic view of FIG. 7 showing only the metal interconnect and shield layers.

Referring to FIG. 7 and FIG. 8 in contrast to FIG. 3, an embodiment 210 includes a shield 212 with a significantly reduced shield area compared to the shield 142 of embodiment 140. While the shield 212 still partially surrounds bond pads (e.g. 28, 34, 60 and 78) to prevent conduction paths from forming between pairs of junctions (where the path follows an indirect route), the reduction in shield area is augmented by the use of lip-shaped structures or "ears" near areas where junctions are connected to the shield 212 with contacts. In embodiment 210, the shield area 214 surrounds the contacts 30, the ear structure 216 surrounds the contacts 54, the ear structure 218 surrounds the contacts 56, the shield area 220 surrounds the contacts 80, the ear structure 222 surrounds the contacts 74, the ear structure 224 surrounds the contacts 96, the ear structure 226 surrounds the contacts 94, and the shield area 228 surrounds the contacts 24. The cumulative width of the ears (and other shield areas) between any pair of junctions is still subject to the limitations of the minimum width 156 discussed for embodiment 140 of FIG. 3.

Figure 9:
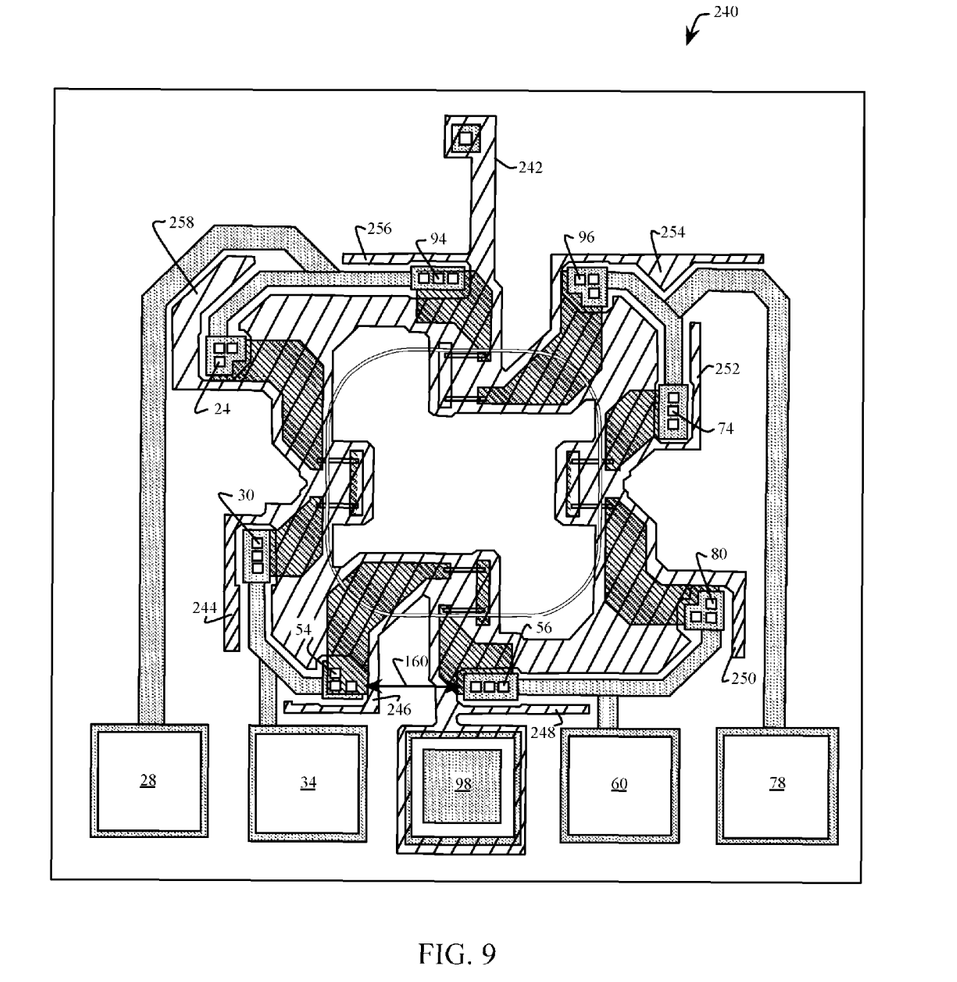
FIG. 9 is a schematic view of an embodiment of a PRT with a charge shield not surrounding bond pads.
Figure 10:
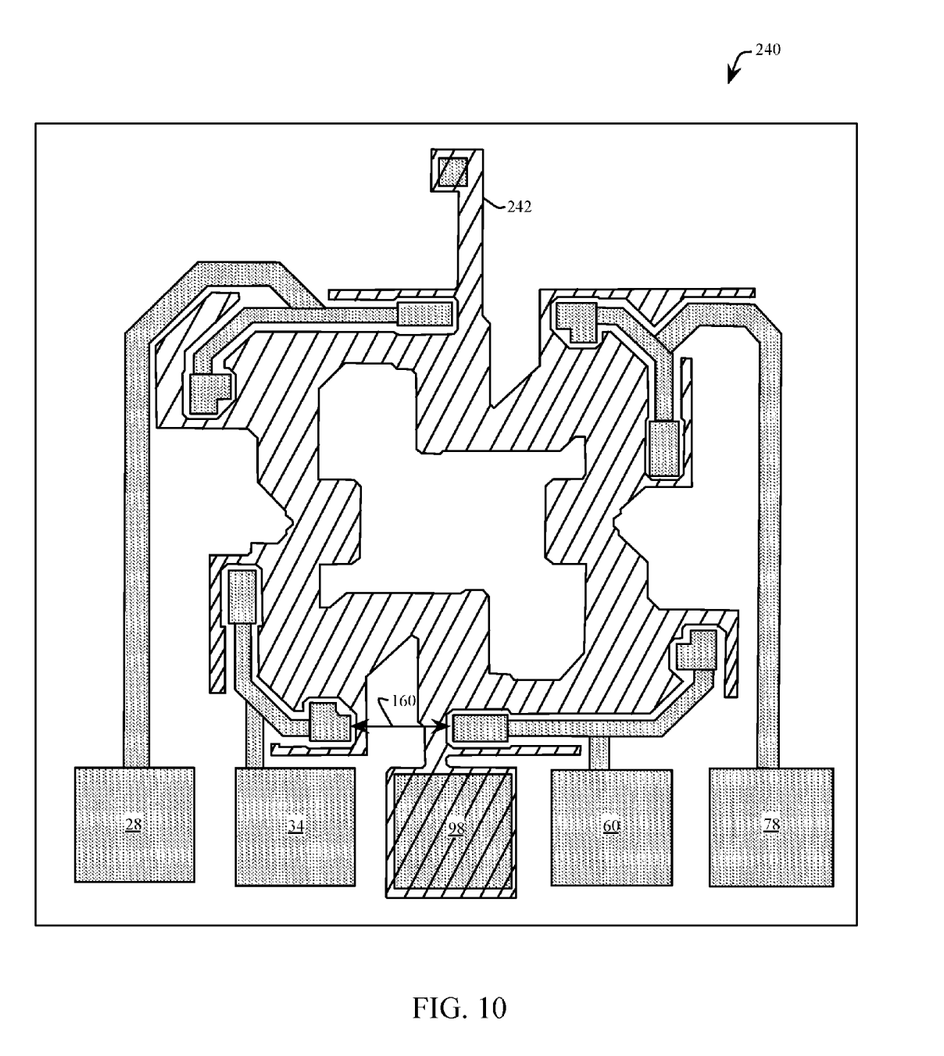
FIG. 10 is a schematic view of FIG. 9 showing only the metal interconnect and shield layers.

Referring to FIG. 9 and FIG. 10 in contrast to FIG. 7, an embodiment 240 includes a shield 242. In embodiment 240, the shield 242 does not surround any of the bond pads (with the exception of the contacted substrate connection through bond pad 98), however all junction contacts are surrounded by ear structures, similar to those used with embodiment 210. Specifically, in embodiment 240, the ear structure 244 surrounds the contacts 30, the ear structure 246 surrounds the contacts 54, the ear structure 248 surrounds the contacts 56, the ear structure 250 surrounds the contacts 80, the ear structure 252 surrounds the contacts 74, the ear structure 254 surrounds the contacts 96, the ear structure 256 surrounds the contacts 94, and the shield area 258 surrounds the contacts 24. The use of ears in embodiment 240 and the partial use of ears in embodiment 210 prevents conductive channels from indirectly forming between junctions by increasing the effective resistance of between the junctions.

In another embodiment, the shield is formed with the same process steps and layer as at least one of the metal interconnects. For embodiments that include a diaphragm (e.g. diaphragm 12 in FIG. 1) the thickness of the conductive layer common to the shield and the metal interconnect is thinner than the thickness used for devices that are connected with bond pads. A thinner conductive layer is realized by using Through-Silicon-Via (TSV) technology rather than wire bond devices with bond pads. Each of the embodiments 140, 210 and 240 are modifiable to form a respective embodiment with a conductive layer shared with the shield and at least one metal interconnect, wherein the bond pads are replaced with TSV technology.

Figure 11:
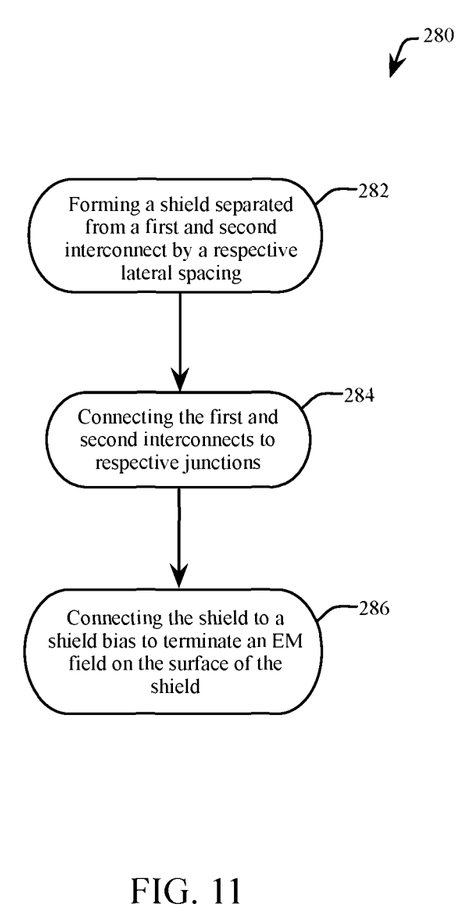
FIG. 11 is flowchart view of a method for manufacturing a semiconductor device in accordance with an embodiment of the present disclosure.

FIG. 11 shows a flowchart of a method 280 for manufacturing a semiconductor device with a shield for actively preventing charge induced leakage paths. At 282, a shield is formed with a separation between a first and second interconnect, each with a respective lateral spacing. In one embodiment, each lateral spacing is different, while in another embodiment each lateral spacing is the same. At 284, the first and second interconnects are connected to respective junctions. In various embodiments, the first and second interconnect are connected to respective junctions with one or more contacts. At 286, the shield is connected to a shield bias to terminate an EM field on a surface of the shield, thereby preventing a first conduction channel from forming between the respective junctions. The shield also prevents the formation of a second conduction channel between the respective junctions wherein the shield has a minimum width between each respective lateral spacing used to separate the shield from the respective interconnect.

As will be appreciated, embodiments as disclosed include at least the following. In one embodiment, a method for manufacturing a semiconductor device comprises forming a shield on the semiconductor device. The shield is separated from a first metal interconnect by at least a first lateral spacing, and separated from a second metal interconnect by at least a second lateral spacing. The shield is connected to a shield bias to terminate an electromagnetic field on a surface of the shield, wherein the shield between the first lateral spacing and the second lateral spacing has a minimum width to substantially prevent formation of a conductive channel between a first doped junction and a second doped junction.

Alternative embodiments of the method for manufacturing a semiconductor device include one of the following features, or any combination thereof. Forming the shield includes partially surrounding a bond pad with the shield to prevent the formation of the conductive channel. Forming the shield over a portion of the first doped junction and over a portion of the second doped junction to substantially prevent formation of another conductive channel between the first doped junction and the second doped junction at a location that does not have the first and second lateral spacings. Forming the shield is contemporaneous with forming the first metal interconnect and the second metal interconnect.

In another embodiment, a structure for preventing charge induced leakage of a semiconductor device comprises a shield on the semiconductor device, wherein the shield is separated from a the first metal interconnect by at least a first lateral spacing, and separated from a second metal interconnect by at least a second lateral spacing, the first metal interconnect being connected to a first doped junction and the second metal interconnect being connected to a second doped junction. A shield bias is connected to the shield to terminate an electromagnetic field on a surface of the shield wherein the shield between the first lateral spacing and the second lateral spacing has a minimum width to prevent formation of a conductive channel between the first doped junction and the second doped junction.

Alternative embodiments of the structure for preventing charge accumulation on a semiconductor device include one of the following features, or any combination thereof. The first doped junction is biased at a different potential than the second doped junction. The shield bias has a different potential than a potential of an accumulated charge on the semiconductor device. The shield bias is equal to a substrate bias. The first doped junction and the second doped junction are PFET junctions. The shield partially surrounds a bond pad to prevent the formation of the conductive channel. The shield is formed over a portion of the second doped junction to substantially prevent formation of another conductive channel between the first doped junction and the second doped junction at a location that does not have the first and second lateral spacings. The shield is a same conductive layer as at least one of the first metal interconnect and the second metal interconnect, and the shield is electrically isolated from the first and second interconnects. The structure includes a through-silicon-via. The semiconductor device is a microelectromechanical system (MEMS). The MEMS is a piezo-resistive transducer. The shield includes Titanium Nitride.

In another embodiment, a structure for preventing charge induced leakage of a microelectromechanical system (MEMS) device comprises a shield of the MEMS device separated from a first interconnect by at least a first lateral spacing and separated from a second metal interconnect by at least a second lateral spacing, the first interconnect being connected to a first junction and the second interconnect being connected to a second junction. A substrate bias is connected to the shield to terminate an electromagnetic field on the shield wherein the shield between the first lateral spacing and the second lateral spacing has a minimum width to prevent formation of a conductive channel between the first junction and the second junction.

Alternative embodiments of the structure for preventing charge accumulation on a microelectromechanical system (MEMS) device include one of the following features, or any combination thereof. The shield partially surrounds a bond pad to prevent the formation of the conductive channel. The shield is formed over a portion of the first junction and over a portion of the second junction to substantially prevent formation of another conductive channel between the first junction and the second junction at a location that does not have the first and second lateral spacings. The shield is a same conductive layer as at least one of the first interconnect and the second interconnect.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A structure for preventing charge induced leakage of a semiconductor device comprising:
   a shield on the semiconductor device, wherein the shield is separated from a first metal interconnect by at least a first lateral spacing and separated from a second metal interconnect by at least a second lateral spacing, the first metal interconnect connects a first doped junction to another first doped junction, and the second metal interconnect connects a second doped junction to another second doped junction, the shield surrounds each of a plurality of first contacts to the first metal interconnect and a plurality of second contacts to the second metal interconnect, the shield configured to contact at least one of the first metal interconnect and the second metal interconnect at all locations where the shield has a vertical overlap between with the respective first metal interconnect and second metal interconnect, the vertical overlap orthogonal to the first lateral spacing and the second lateral spacing; and
   a shield bias connected to the shield to terminate an electromagnetic (EM) field on a surface of the shield wherein the shield between the first lateral spacing and the second lateral spacing has a minimum width to prevent formation of a conductive channel between the first doped junction and the second doped junction.

2. The structure of claim 1 wherein the first doped junction is biased at a different potential than the second doped junction.

3. The structure of claim 1 wherein the shield bias has a different potential than a potential of an accumulated charge on the semiconductor device.

4. The structure of claim 1 wherein the shield bias is equal to a substrate bias.

5. The structure of claim 1 wherein the first doped junction and the second doped junction are PFET junctions.

6. The structure of claim 1 wherein the shield partially surrounds a bond pad to prevent the formation of the conductive channel.

7. The structure of claim 1 wherein the shield is formed over a portion of the first doped junction and over a portion of the second doped junction to substantially prevent formation of another conductive channel between the first doped junction and the second doped junction at a location that does not have the first and second lateral spacings.

8. The structure of claim 1 wherein the shield is a same conductive layer as at least one of the first metal interconnect and the second metal interconnect, and the shield is electrically isolated from the first and second metal interconnects.

9. The structure of claim 8 wherein the structure includes a through-silicon-via.

10. The structure of claim 1 wherein the semiconductor device is a microelectromechanical system (MEMS).

11. The structure of claim 10 wherein the MEMS is a piezo-resistive transducer.

12. The structure of claim 1 wherein the shield includes Titanium Nitride.

\* \* \* \* \*